United States Patent
Hashemi et al.

(12) 
(10) Patent No.: US 6,377,464 B1
(45) Date of Patent: Apr. 23, 2002

(54) MULTIPLE CHIP MODULE WITH INTEGRATED RF CAPABILITIES

(75) Inventors: Hassan Hashemi, Laguna Niguel; Shiaw Chang, Thousand Oaks; Roger Forse, Santa Barbara; Evan McCarthy, Costa Mesa; Trang Trinh, Cypress; Thuy Tran, El Monte, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/239,617

(22) Filed: Jan. 29, 1999

(51) Int. Cl.[7] ............................................. H05K 7/02
(52) U.S. Cl. .................. 361/760; 361/761; 361/762; 361/763; 361/764; 361/766; 361/777; 361/782; 361/715; 257/713; 257/516
(58) Field of Search ................. 361/760, 762–763, 361/764, 766, 777, 782, 715; 257/713, 697, 516, 778

(56) References Cited

U.S. PATENT DOCUMENTS

| | | | |
|---|---|---|---|
| 4,739,448 A | 4/1988 | Rowe et al. | |
| 5,182,632 A | * 1/1993 | Bechtel et al. | 257/713 |
| 5,485,036 A | 1/1996 | LaRosa | |
| 5,703,753 A | * 12/1997 | Mok | 361/715 |
| 5,719,750 A | * 2/1998 | Iwane | 361/794 |
| 5,825,628 A | 10/1998 | Garbelli et al. | |
| 5,990,545 A | * 11/1999 | Schueller et al. | 257/697 |

FOREIGN PATENT DOCUMENTS

| | | | |
|---|---|---|---|
| EP | 0 491 161 A1 | 6/1992 | H01L/23/538 |
| EP | 0 596 596 A1 | 5/1994 | H01L/23/538 |
| EP | 0 675 539 A2 | 10/1995 | H01L/23/538 |

* cited by examiner

*Primary Examiner*—Jeffrey Gaffin
*Assistant Examiner*—Thanh Y. Tran
(74) *Attorney, Agent, or Firm*—Farjami & Farjami LLP

(57) ABSTRACT

A multiple chip module (MCM) for use with baseband, RF, or IF applications includes a number of active circuit chips having a plurality of different functions. The active circuit chips are mounted on a substrate that is configured to provide an integrated subsystem in a single MCM package. The MCM includes a number of features that enable it to meet electrical performance, high-volume manufacturing, and low-cost requirements. The MCM may incorporate split ground planes to achieve electronic shielding and isolation, vias configured as both thermal sinks and grounding connections, and specifically configured die attach pads and exposed ground conductor pads.

76 Claims, 8 Drawing Sheets

MULTIPLE CHIP MODULE WITH INTEGRATED RF CAPABILITIES

FIELD OF THE INVENTION

The present invention relates generally to multiple chip modules (MCMs) that are utilized for radio frequency and intermediate frequency applications. More specifically, the present invention relates to MCM features that enable low-cost and high-volume manufacturing of modules that integrate the functionality of different active circuit chips.

BACKGROUND OF THE INVENTION

Multiple chip modules (MCMs) are distinct electronic packages that may contain a number of bare and/or packaged integrated circuit (IC) chips and a number of discrete components (e.g., resistors, capacitors, and inductors) coupled to an interconnecting substrate. Traditional MCMs consist of a very complex multilayer interconnect substrate with several bare die and other components. Each prior art MCM has a custom size and need not necessarily fit a standard "package" format as commonly known in the IC packaging industry. In other words, each prior art MCM substrate (compared to an MCM package) is typically designed, handled, and tested in a different manner. MCMs are often utilized in a number of electronic applications, such as personal computers, mainframe computers, telecommunication, and telephony systems, where a number of components having similar electrical characteristics or having similar electrical paths can be grouped together in a single package. Although basic MCM design and manufacturing technologies are relatively well known, such conventional technologies have not facilitated a low-cost, high-volume production process. Many MCM packaging technologies house only bare die and some house bare die and discrete components. However, prior art MCM packages with bare and packaged dies and discrete components are utilized for multi-GHz applications. In addition, conventional MCM techniques have not been extended to radio frequency (RF) applications, e.g., applications having circuits operating at frequencies greater than approximately 800 MHz, and intermediate frequency (IF) applications, e.g., applications having circuits operating at frequencies between approximately 200 and 800 MHz.

The increasing demand for higher levels of circuit integration, lower manufacturing cost, easier upgradeability, and smaller component sizes has been very difficult to meet in the context of RF and IF applications. This difficulty is related to a number of practical reasons. For example, shielding and signal isolation between different RF and/or IF circuit components typically limits the number of active components that can be included in a single MCM. In addition, regulatory limits on electromagnetic interference (EMI) and emissions may further restrict the design parameters associated with conventional RF/IF modules. Furthermore, thermal dissipation from some RF circuit chips may place another burden on conventional module designs.

As a result of the foregoing shortcomings of prior art designs, conventional RF/IF packages are generally limited in terms of use in high-volume applications. At best, conventional RF/IF MCMs function at a component level (below the subsystem level); a number of physically discrete MCMs are typically used to achieve an operable subsystem or system in conjunction with a motherboard that serves as an interconnect structure. Each of the individual MCMs may be adequately shielded to avoid RF interference with one another and to reduce the amount of EMI emissions associated therewith. Unfortunately, the use of individual MCMs increases the design and manufacturing cost because individual partitioning, matching, and isolation networks may be required between the various MCMs.

In addition to the above problems, conventional MCMs may not be sufficiently flexible to accommodate a number of design alternatives. For example, it may not be possible or economical to combine surface mount and wire bonding techniques in a single prior art MCM and it may not be possible to include different active IC types (e.g., CMOS, GaAs, bipolar) on one prior art MCM substrate. Furthermore, conventional MCMs may not have the flexibility to utilize different types of vias for thermal sinking and RF grounding purposes or the flexibility to employ different types of terminations from application to application.

SUMMARY OF THE INVENTION

In accordance with the present invention, a single RF/IF MCM may include a plurality of active circuit chips and a plurality of discrete components coupled to one interconnecting substrate. The MCM can be configured to perform any number of different RF/IF functions such that it operates as an independent subsystem. A high level of integration, the use of RF isolation techniques, and the use of thermal sinking techniques enable the MCM to function in a manner equivalent to a number of separate conventional modules without the associated design and manufacturing costs. In addition, an RF/IF MCM may be designed in a flexible manner that contemplates various manufacturing, electrical, environmental, and testing parameters.

The above and other advantages of the present invention may be carried out in one form by an MCM having an interconnect substrate, a number of surface mount passive components coupled to the interconnect substrate, and at least one active circuit device coupled to the interconnect substrate. The at least one active circuit device is configured to perform a plurality of RF functions such that the MCM operates as an integral package.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF PREFERRED EXEMPLARY EMBODIMENTS

The following description may refer to RF components, RF circuits, and RF signals in the context of a number of preferred exemplary MCM embodiments. In accordance with conventional terminology and current technology, "RF" means frequencies above approximately 800 MHz. Nonetheless, the techniques of the present invention may be extended for use with IF frequencies within the range of approximately 200 MHz to 800 MHz. Furthermore, the terms "RF" and "IF" are not intended to place any limitations or restrictions on the present invention.

Conventional techniques and elements associated with the design and manufacturing at the circuit chip level, the substrate level, and the MCM level may be employed in a practical device that is configured in accordance with the present invention. Such conventional techniques, which are generally known to those skilled in the art, will not be described in detail herein. For example, fundamental techniques related to the manufacture of ceramic and/or laminate substrates, gold or copper plating, soldering, RF signal isolation, and the like may be practiced in an actual device.

Figure 1:
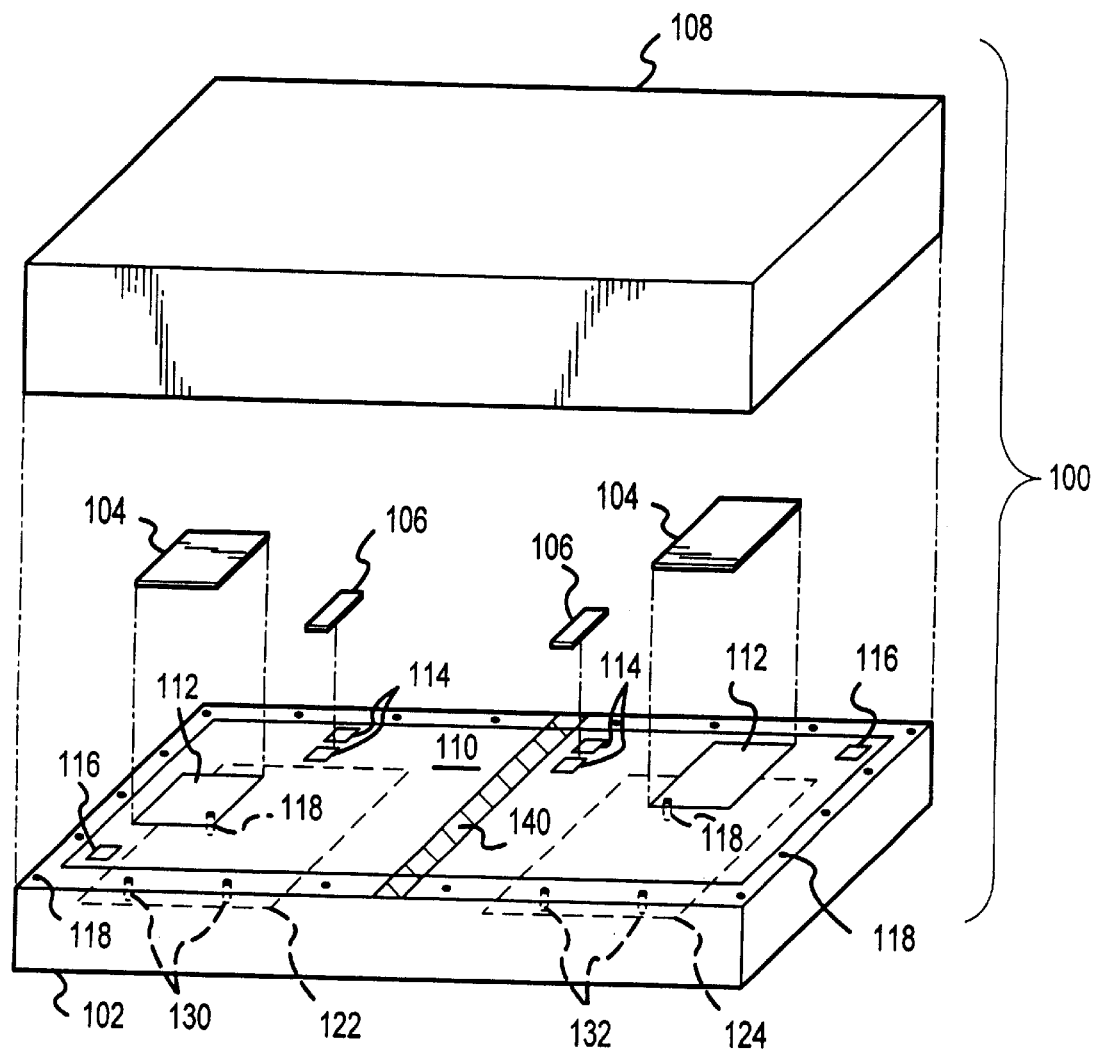
FIG. 1 is an exploded perspective view of an MCM.

Referring to FIG. 1, an RF MCM 100 generally includes a substrate 102, a number of active circuit chips 104, and a number of discrete components 106. In a practical embodiment, MCM 100 may be approximately 36 mm$^2$ to approximately 375 mm$^2$ in size. Although any number of devices may be employed, MCM 100 preferably includes two or three active devices and between 10 and 100 passive components.

Active circuit chips 104 may be configured to perform any number of suitable functions. The specific function of active circuit chips 104 will vary from application to application. For example, a single active circuit chip 104 may be suitably designed to function as an RF transmitter, an RF receiver, an RF transceiver, a low noise amplifier (LNA), a variable gain amplifier (VGA), or the like. As described below, MCM 100 is particularly suited for use with multifunction active circuit chips 104, i.e., a single chip that performs two or more different electronic functions or a single chip that contains features normally associated with a number of separate and distinct chips.

In one practical embodiment, MCM 100 is configured for use in a cordless telephone system. Unlike prior art systems that may require separate RF and baseband packages, MCM 100 may be integrated to include, e.g., a 45 MHz baseband section and a 900 MHz RF section. Other practical applications for MCM 100 include a multiband RF amplifier that is capable of concurrent operation at 800 MHz, 1800 MHz, and 2.4 GHz.

MCM 100 is configured to accommodate the use of different types of active circuit chips 104. For example, active circuit chips 104 may be based on CMOS, bipolar, GaAs, or other suitable die technologies. Substrate 102 may be suitably designed to facilitate the mounting of silicon, GaAs, and/or other die substrate materials. Active circuit chips 104 may be bare dies or packaged assemblies. Bare RF chips and the corresponding wire bonds may be structurally reinforced and electrically isolated with a suitable epoxy or other encapsulant material. The bare die 104 may be interconnected to substrate 102 by means of wire bond, tape-automated bond, or flip-chip. The latter is generally known to those skilled in the art, and will not be described in detail herein.

Discrete components 106, which are generally mounted to substrate 102 using surface mount techniques, may include resistors, capacitors, inductors, transistor packages, and the like. In the preferred embodiment, surface mounted discrete components 106 are sized in accordance with well known packaging conventions. For example, discrete components 106 are typically either 0402 or 0603 sizes. Passive components may alternatively or additionally be located on the active chips themselves. The number and location of devices on the modules may be driven by electrical performance criteria, cooling, mechanical reliability, and/or assembly considerations.

In a preferred embodiment in which RF isolation or EMI emissions are a design consideration, MCM 100 includes a metal lid 108. In an alternate embodiment, MCM 100 may employ conventional plastic overmolding techniques to provide a suitable "cover" over substrate 102. Overmolding may be utilized for applications that can tolerate more RF interference and/or for applications that have less strict EMI requirements. Such overmolding processes and materials are generally well known and will not be described in detail herein.

Figure 6:
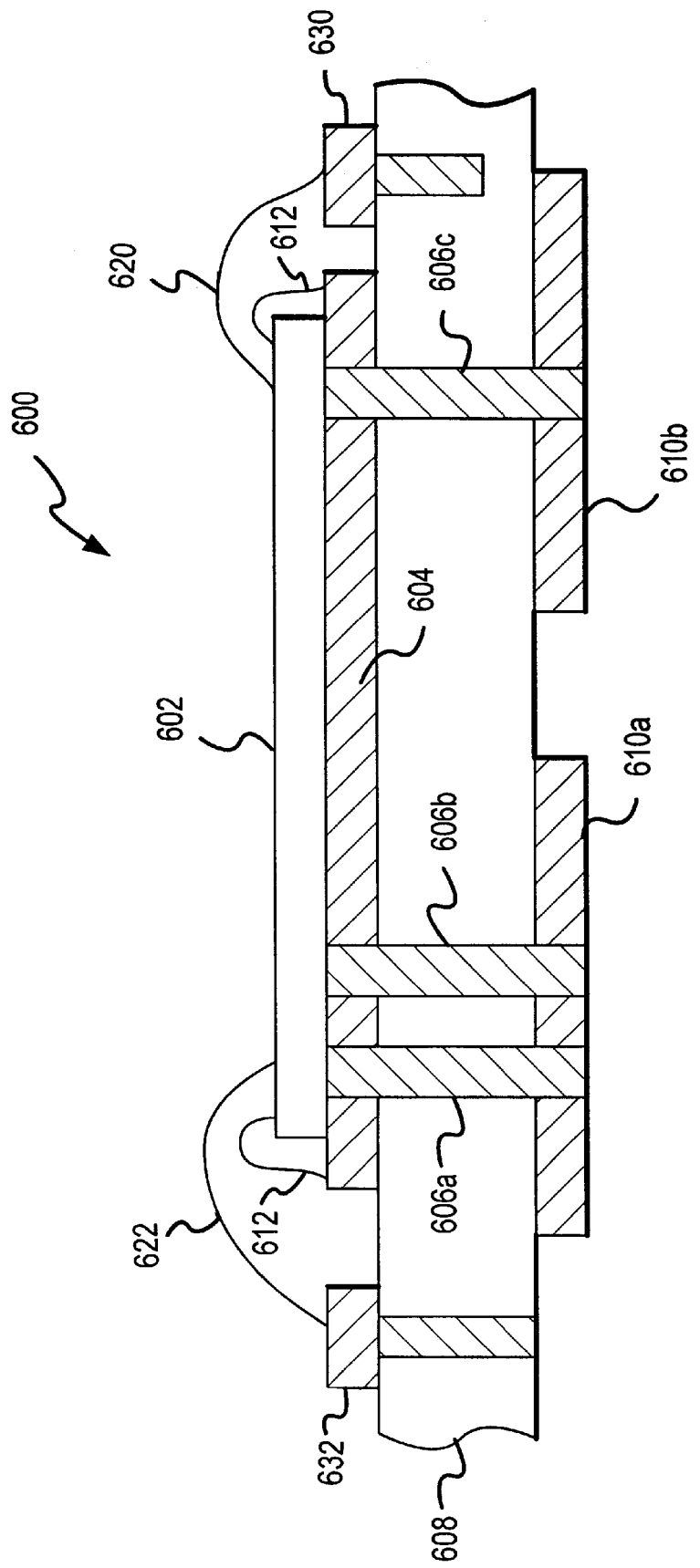
FIGS. 6–7 are schematic cross sectional views of exemplary MCMs.
Figure 7:
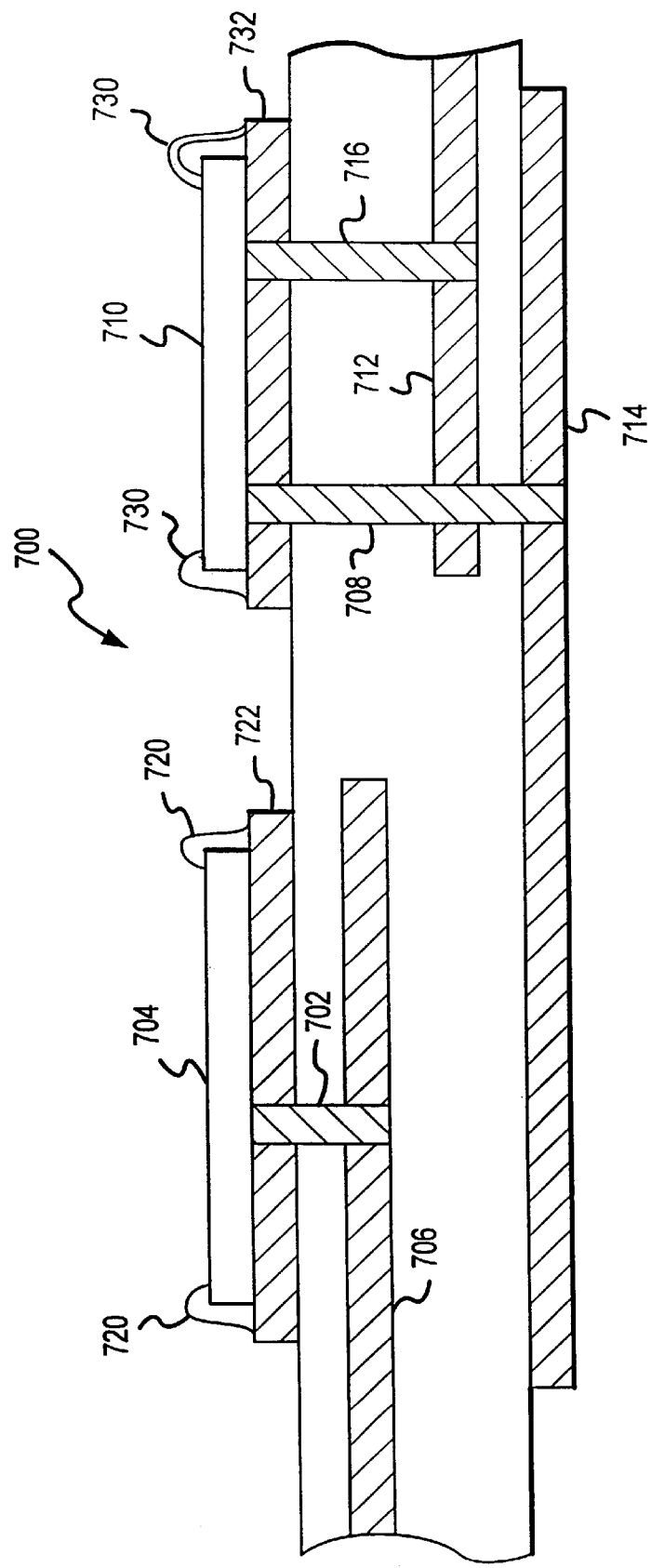
Figure 8:
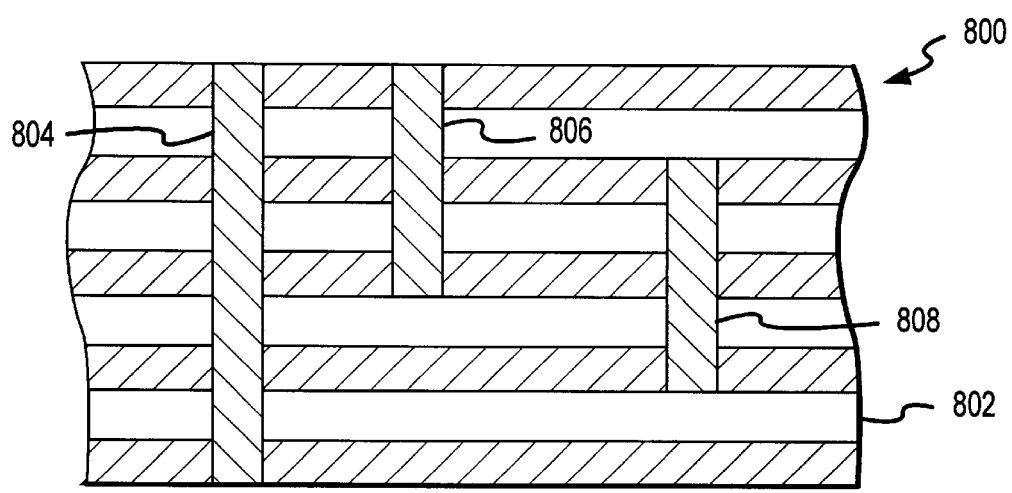
FIG. 8 is a schematic cross sectional view of a portion of an MCM.

Substrate 102 may be a laminate (organic) material or a ceramic (inorganic) based material. In many current applications, a laminate substrate material is preferred due to ease of manufacturing, and the electrical, thermal, and mechanical properties associated with the laminate material. As shown in FIGS. 6–8 (and in phantom lines in FIG. 1), substrate 102 may include any number of metal layers with alternating dielectric layers. Any suitable material may be used to produce substrate 102; common glass-based polymers such as BT, FR4, or PTFE may be utilized for the dielectric material and any suitable conductive metal such as copper may be used for the metal layers. A practical exemplary substrate 102 would include one to eight metal layers; the preferred embodiment includes two to four metal layers. As with conventional substrate designs, the upper and lower metal layers are typically exposed, while an internal or embedded metal layer may be sandwiched between at least two dielectric layers. The formation of substrate 102, including the formation of the conductive metal lines and pads, is beyond the scope of this description.

In a preferred embodiment, the first or top metal layer is a circuit layer and the underlying metal layer is a ground layer. The ground layer suitably isolates the circuit lines on the top layer from circuit lines on other layers, e.g., the bottom layer. The ground layer may also serve to define the impedance of the RF lines on the top layer. In RF applications, the thickness of the dielectric layer between the circuit layer and the ground layer can be adjusted during the design stage to achieve the desired impedance of the top layer lines. The impedance is also dictated by the width of the circuit lines and by the adjacency of any other conductive lines.

The exposed upper surface 110 of substrate 102 includes a number of metal areas (remaining from the first metal (M1) layer) separated by dielectric material. For example, a metal die attach pad 112 may be associated with a respective active circuit chip 104. The specific configuration of die attach pad 112, its location on substrate 102, and/or its interaction with other elements of MCM 100 may depend upon the desired electrical performance of MCM 100, the layout and density of the routing within MCM 100, and power management considerations. The active circuit chip 104 can be attached to die attach pad 112 in accordance with any number of suitable methodologies, such as conductive epoxy, solder, or the like. Of course, alternative attachment techniques may be employed depending upon the composition of substrate 102 and/or the material used for die attach pad 112. As described in further detail below, die attach pad 112 may also serve as a ground connect pad and/or a thermal sink area.

Figure 4:
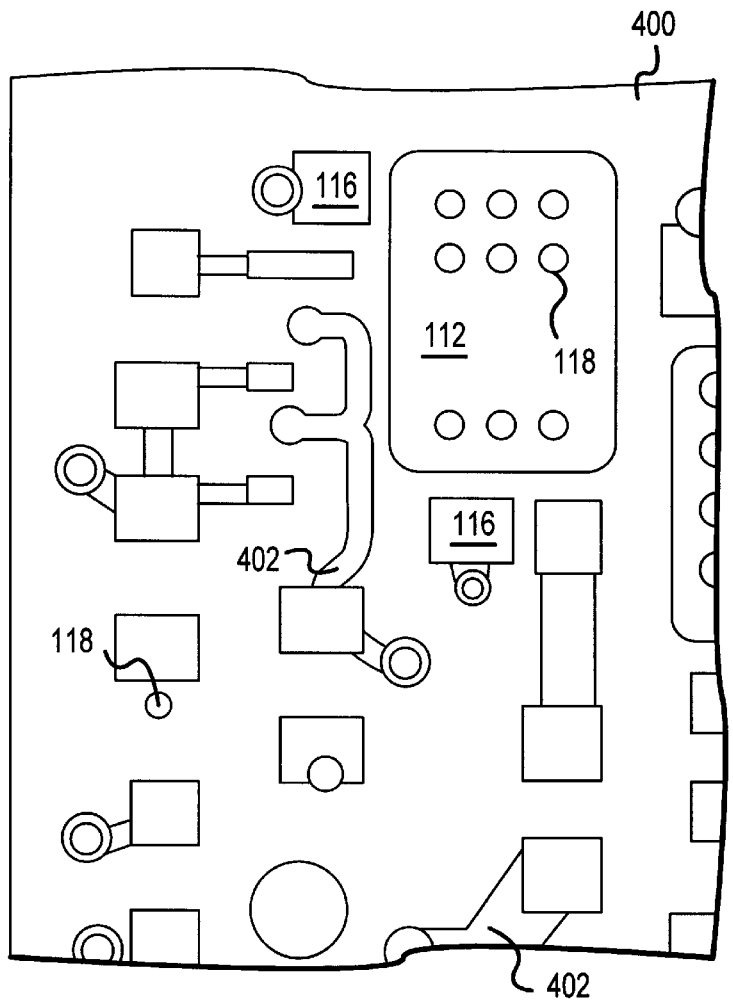
FIG. 4 is a top view of a detailed portion of an exemplary substrate that may be used with an MCM.

Upper surface 110 may also contain a number of contact pads 114 associated with passive components 106. Like attach pads 142 contact pads 114 are preferably formed from the M1 layer. Contact pads 114 may be formed, plated, and treated in accordance with conventional techniques to facilitate surface mounting of passive components 106. Passive components 106 are preferably attached to contact pads 114 using a relatively high-temperature solder. The high-temperature solder remains intact when MCM 100 is subsequently attached to a printed wiring board (PWB) motherboard using reflow techniques. Specific areas on upper surface 110 may be covered by a solder mask material, which prevents solder from flowing into certain areas. Solder mask areas 402 for an exemplary substrate 400 are indicated in FIG. 4. The solder mask areas 402 are typically located near those portions of substrate 102 upon which surface mount components are soldered.

A number of bond pads 116, preferably formed from the M1 layer, may also be resident on upper surface 110. Bond pads 116 may be suitably plated with palladium (Pd) or soft gold to facilitate an electrically and physically robust wire bond. Bond pads 116 may be electrically connected to conductive lines, package terminations, conductive vias, or the like, to establish the electrical functionality of MCM 100 (see FIG. 4). In accordance with conventional wire bonding schemes, a fine gold wire serves as an electrical connection between bond pads 1 16 and a suitable area on active circuit chip 104 (described in more detail below). The present invention utilizes particularly configured die attach pads 112, bond pads 116, and other features of MCM 100 to enhance the electrical performance of the module.

The internal metal layers of substrate 102 may suitably define any number of conductive lines, printed components (e.g., inductors, transformers, capacitors, and resistors), ground planes, terminations, or the like. Embedded components (e.g., inductors, transformers, capacitors, and resistors) may also be utilized within substrate 102. In preferred embodiments, plated or filled vias 118 function as thermal and/or electrical paths between layers of substrate 102.

MCM 100 includes a number of design elements and features that enable the integration of a plurality of baseband, RF, IF, and/or other active electronic chips onto a single substrate 102.

Notably, the various active chips included in MCM 100 need not be grouped together in terms of their electrical characteristics or functions. In contrast to prior art MCM schemes, MCM 100 can accommodate the presence of a plurality of RF functions by providing a sufficient amount of RF isolation between the different RF elements even though the actual MCM size is relatively small (prior art applications, e.g., cellular telephones, may utilize isolation techniques, however the substrate is relatively large and the functionalities are separated on their respective substrates). The different active circuits may have respective partitioning, isolation, and/or matching networks integrated into substrate 102. In this manner, MCM 100 eliminates the need to design and implement external matching and isolation circuitry between two distinct packaging modules.

MCM 100 is suitably configured to enable the integration of multiple active device technologies while meeting the design requirements for RF performance, isolation, shielding, testability, cooling, reliability, and physical handling of the module. Furthermore, the configuration of MCM 100 enables it to be manufactured in high volumes at relatively low cost. Those aspects of MCM 100 that enable these design objectives to be met are described in detail below.

Heat Sinking and RF Grounding

Active circuit chips, and particularly RF chips, generally have a high power density. A small RF chip may be capable of producing between 0.1 to 5 watts of thermal power; the heat generated by such chips is typically routed to an appropriate heat sink to prevent overheating of the active chip and/or the module itself. To facilitate an adequate heat transfer rate, active devices 104 may be attached to die attach pads 112, which are formed from a material having low thermal and electrical resistivity. In accordance with a preferred aspect of the present invention, MCM 100 utilizes filled vias as thermal vias to conduct heat from the active circuit chips to a suitable heat spreading element or conductive pad. In a preferred embodiment, the heat spreading element may also serve as an RF ground plane.

A cross section of a portion of one exemplary MCM 600 is schematically depicted in FIG. 6. MCM 600 preferably includes an active circuit chip 602 suitably attached to an exposed die attach pad 604. A number of through vias 606 are formed within a substrate 608; through vias 606 run from die attach pad 604 to at least one conductive pad 610 formed at the lower surface of substrate 608. Vias 606 may be formed in accordance with any number of conventional techniques. In the preferred embodiment, vias 606 are initially plated, then filled with a suitable material that is electrically and thermally conductive (e.g., copper paste, conductive epoxy, prepreg, or the like).

In the preferred embodiments, vias that are employed as thermal vias are suitably filled with a thermally conductive material. The filler material prevents the die attach material from flowing through the "open" plated through vias. The filler material also prevents solder from wicking up through the via when the MCM package is soldered to the next-level board or assembly.

The filled vias 606 are configured to function as both thermal vias and electrical conductors for RF ground. Upon installation of MCM 600 onto a motherboard, conductive pads 610 may serve as a ground potential for active circuit chip 602 by way of die attach pad 604. To provide the ground to active circuit chip 602, wire bonds 612 may be attached at one end directly to die attach pad 604 and at the other end directly to an appropriate location on active circuit chip 602. In this manner, vias 606 provide a thermal path from active circuit chip 602 to the motherboard and provide a direct and low-inductance ground path from active circuit chip 602 to the motherboard and/or to an internal ground layer.

In accordance with the present invention, the location of the RF ground plane, the configuration of vias, and the conductive paths from the active circuit chips to the RF ground may vary according to the particular application. For example, FIG. 7 depicts a cross section of a portion of another exemplary MCM 700. MCM 700 includes a blind via 702 (blind via 702 may either be plated or plated and filled) that thermally and electrically couples a first active chip 704 to an internal ground plane 706. Although not shown, internal ground plane 706 may in turn be connected to a suitable ground termination and/or a suitable heat sink. MCM 700 also includes a plated through via 708 that thermally and electrically couples a second active chip 710 to an internal ground plane 712 and an exposed conductive pad 714. Notably, internal ground planes 706 and 712 may reside at different metal layers (as shown) or at the same metal layer. As described above in connection with FIG. 6, conductive pad 714 may be soldered or otherwise attached in a conductive manner to a motherboard that provides a good RF ground. Another filled/plated blind via 716 penetrates or spans three metal layers to connect second active chip 710 with internal ground plane 712.

Split Ground Planes

Referring to FIGS. 1 and 5–7, split ground planes on the same or different metal layers of a substrate are preferably utilized to obtain RF isolation between a plurality of active circuit chips and/or between different functional sections on a single active circuit chip. As shown in FIG. 1, MCM 100 may include two functionally distinct portions (each portion being associated with one of the two active chips 104) contained on a single substrate 102. To reduce the amount of unwanted RF interference between the two portions, MCM 100 preferably includes a first ground plane 122 and a separate second ground plane 124. In the context of FIG. 1, first and second ground planes 122 and 124 are formed upon the same internal metal layer. As described in more detail herein, MCM 100 may utilize vias 118 to establish an electrical connection between the ground planes and the respective die attach pads 112. Ground planes 122 and 124 may be suitably coupled to a ground provided by a motherboard assembly or to an appropriate termination on MCM 100 (not shown in FIG. 1).

It should be appreciated that the specific size and shape of ground planes 122 and 124 can vary depending upon the given design. For example, FIG. 7 illustrates a first active circuit chip 704 having an internal ground plane 706 associated therewith. Wire bonds 720 establish a direct conductive path between a die attach pad 722 and circuit chip 704. Thus, for RF purposes, circuit chip 704 and ground plane 706 are operatively and functionally related. However, a second active circuit chip 710 has an RF ground plane 712 located at a different level than ground plane 706. In addition, circuit chip 710 may be associated with a conductive ground pad 714 that also serves as an attachment area between MCM 700 and the next assembly level, e.g., a motherboard. Downbonds 730 serve to establish an RF ground to circuit chip 710 by way of die attach pad 732.

Figure 5:
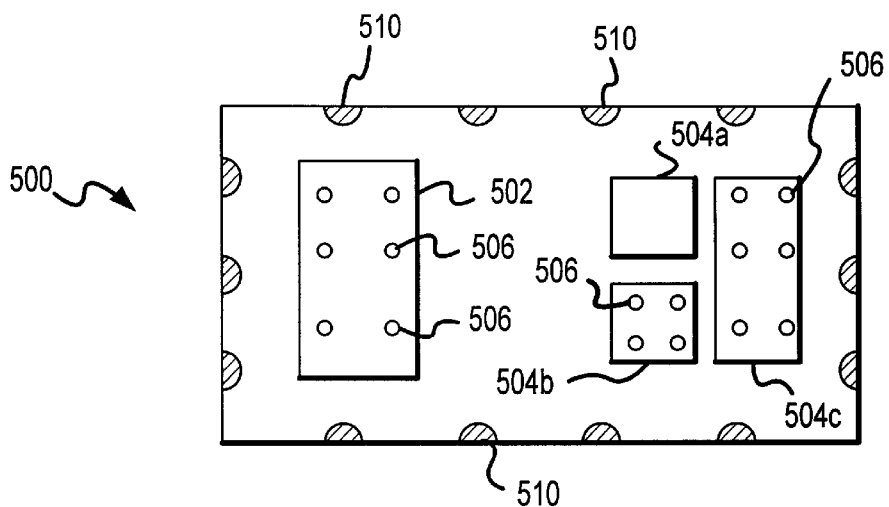
FIG. 5 is a schematic bottom view of an MCM.

As depicted in FIGS. 5 and 6, the split ground plane feature is not limited to internal metal layers. In FIG. 6, a first conductive ground pad 610a is separated from a second conductive ground pad 610b; the separate ground pads may serve to isolate different functional areas on the single active circuit chip 602. FIG. 5 is a bottom view of an alternate MCM 500 in which two active circuit chips (not shown) may be mounted. MCM 500 includes a first conductive ground pad 502 associated with a first active circuit chip and a plurality of conductive ground pads 504 associated with a second active circuit chip. Through vias 506 indicate that the respective ground pads are electrically and/or thermally coupled to an active chip or to a portion of an active chip. Blind vias may also be employed to electrically couple an internal ground layer to one or more conductive ground pads.

Notably, conductive ground pads 504 are divided to facilitate local RF isolation for a single active circuit chip. For example, the portion of the active chip located above pad 504c may have a distinct function or different electrical characteristics than the portion of the active chip located above pad 504a or 504b. In addition, for various design reasons, the portion of active chip located above pad 504a may have an internal ground plane associated therewith or it may not require a separate RF ground.

The design criteria for the specific arrangement and configuration of the ground planes may depend upon the electrical requirements, the desired impedance for the active lines, the active line density, and other factors. In accordance with the preferred embodiment, the use of active circuit chips having multiple and isolated RF functions on a single dielectric substrate can be achieved in a practical and manufacturable product using the split ground plane techniques described herein.

Faraday Cage

Figure 2:
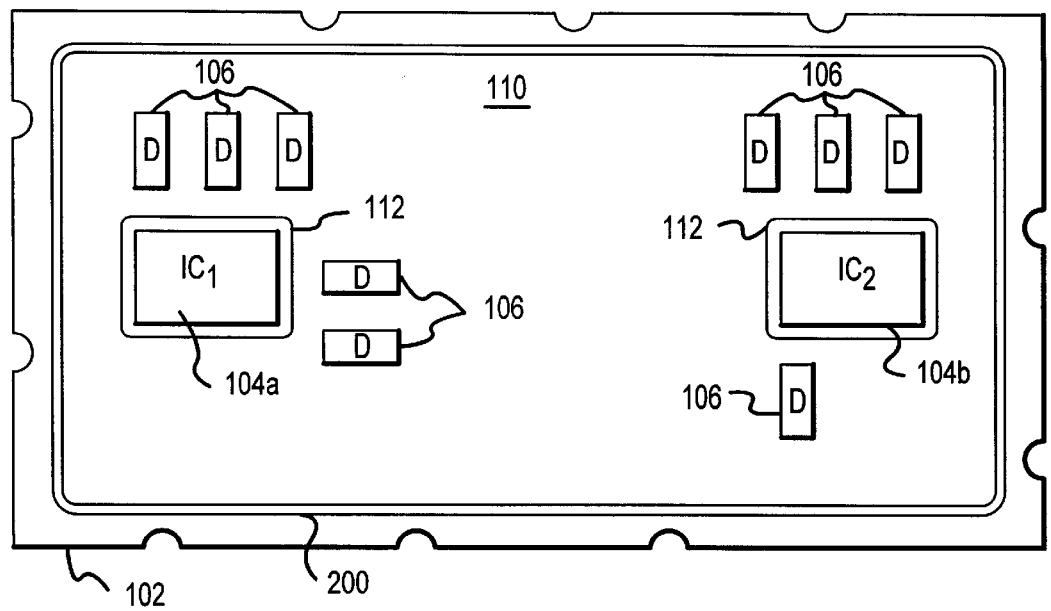
FIG. 2 is a schematic top view of an MCM showing an exemplary arrangement of active chips and discrete components.
Figure 3:
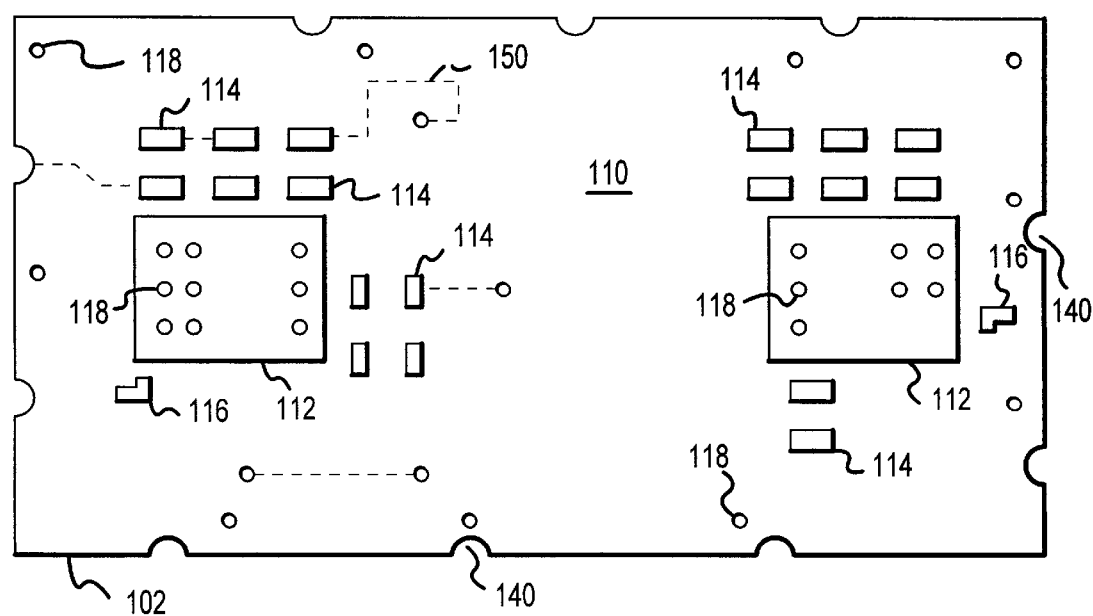
FIG. 3 is a schematic top view of an exemplary substrate that may be used with the MCM shown in FIG. 2.

Referring to FIGS. 1–3, MCM 100 may accomplish RF isolation and EMI shielding through the use of a metal lid 108 and suitable ground connections that form a Faraday cage around certain components in MCM 100. Of course, some MCM designs can tolerate the RF or EMI interference; those packages need not employ metal lid 108 and may instead rely on conventional overmolding techniques.

As best shown in FIGS. 1 and 3, a number of conductive vias are preferably formed around the periphery of substrate 102. The precise number and location of these vias may be dictated by the ground plane configuration and the number and type of components protected by the Faraday cage. For example, the spacing between the peripheral vias is preferably selected to ensure that MCM 100 is adequately protected against RF interference of a certain frequency or frequencies. Generally, the peripheral vias are spaced less than one-twentieth of the wavelength of the unwanted signal.

A conductive ring 200 (see FIG. 2) is formed around the perimeter of substrate 102 and, preferably, over the peripheral vias. In practice, conductive ring 200 may be initially formed, followed by the introduction of the peripheral vias in or proximate to conductive ring 200. In the preferred embodiment, conductive ring 200 is either plated onto or etched into substrate 102. Metal lid 108 is attached to conductive ring 200 using known soldering or conductive epoxy attachment techniques such that metal lid 108 and at least a portion of conductive ring 200 are electrically coupled.

The peripheral vias are preferably configured such that they are electrically coupled to a metal ground plane internal to substrate 102. For example, FIG. 1 depicts peripheral vias 130 and 132 respectively coupled to ground planes 122 and 124. Thus, metal lid 108, conductive ring 200, and one or more ground planes may function to isolate and shield portions of the active circuitry on substrate 102. The Faraday cage protects MCM 100 from outside RF and EMI interference, and the Faraday cage may be appropriately configured to protect and isolate different sections within MCM 100. A Faraday cage may be desirable in certain applications, e.g., cordless and cellular phones, where RF or EMI emissions and interference may be regulated.

It should be appreciated that conductive ring 200 need not be continuous and that metal lid 108 need not form a physical seal around the perimeter of substrate 102. For example, the conductive ring 200 may be continuous for only one section of the MCM (e.g., a receiver section). Discontinuities may be intentionally created in an effort to only isolate and shield a specific portion of the MCM circuitry (e.g., only an RF transmit section). Prior art isolation techniques may employ separate metal lids or a metal lid having physical partitions or walls designed to compartmentalize the lid.

To enhance the shielding and isolating effects of the Faraday cage, MCM 100 may include at least one exposed conductive strip 140 (see FIG. 1) formed on substrate 102. In a preferred embodiment, conductive strip 140 is formed as a copper slot that extends across the entire substrate 102. The conductive strip 140 is electrically coupled to one or more ground planes by way of the peripheral vias. In addition, metal lid 108 may be conductively attached (with solder or another suitable material) to conductive strip 140. The use of conductive strip 140, in conjunction with split ground planes 122 and 124, can effectively create a divided Faraday cage without having to form additional grounding connections with metal lid 108.

Configuration of Vias

Referring to FIGS. 3–10, an MCM in accordance with a preferred feature of the present invention employs vias that are configured and located to enhance the electrical and thermal characteristics of the MCM. As previously described, the vias may either be plated vias or filled plated vias, depending upon the desired function of the particular via (e.g., for thermal dissipation and/or for RF grounding).

As shown in FIG. 8, and as described in more detail herein, an exemplary MCM 800 may employ any combination of through vias 804, blind vias 806, and buried vias 808 in a single dielectric substrate 802 designed to accommodate a number of active circuit dies or a single active circuit die having multiple functions. The specific arrangement of through vias 804, blind vias 806, buried vias 808, and other elements of MCM 800 (as described herein) may be dictated by the desired electrical performance criteria, the physical requirements, and manufacturing issues related to MCM 800. Blind vias 806 may be employed to route an RF signal through its shortest route to an inner layer or to form an embedded transformer. If a plated through hole/via were used instead, it may land on the bottom exposed ground pad. Since the ground pad is at a different potential, an anti-pad isolation region from the rest of the ground feature on the bottom layer would be required. Furthermore, the through via would need to be covered with solder mask so that the mounting solder for the MCM package does not short the via to the adjacent ground feature. Consequently, blind vias can shorten the signal route and make the final finished package easier to surface mount.

Figure 9:
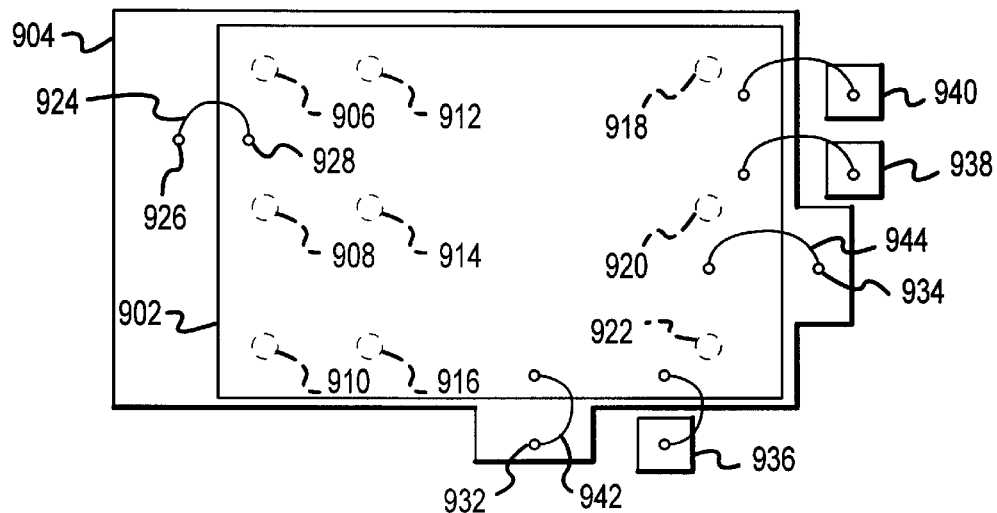
FIGS. 9–10 are each a schematic top view of a respective portion of an MCM substrate with an active circuit chip mounted thereon.

The particular arrangement of vias relative to a die attach pad and/or an active circuit chip may also serve to enhance the electrical or thermal properties of the MCM. For example, as best shown in FIG. 9, an exemplary active circuit chip 902 may be associated with and suitably coupled to a corresponding die attach pad 904. A number of vias 906–922 (shown in phantom) are preferably configured such that they form an electrical connection with die attach pad 904. For effective thermal sinking, the active circuit die will overlap all of the thermal vias. FIG. 4 shows a similar die attach pad 112 and other exposed metal elements on an exemplary substrate 400. As described herein, such vias may be any combination of plated and/or filled through vias or blind vias (buried vias are not coupled to any exposed metal layers). As described above, through hole vias that are shorted to a ground plane on an exposed layer are filled to avoid problems during subsequent mounting of the MCM package.

In the exemplary embodiment shown in FIG. 9, vias 906–916 may be associated with one portion of active circuit chip 902 and vias 918–922 may be associated with another portion of active circuit chip 902. In this context, the different portions of active circuit chip 902 may have functional elements that are located on respective areas of circuit chip 902. The relative separation of vias 906–916 from vias 918–922 may reflect a desire to electrically or thermally isolate the two portions of circuit chip 902. RF isolation of active circuitry enables the MCM to integrate a plurality of RF functions onto a single dielectric substrate. The electrical isolation may be further enhanced through the use of divided ground planes respectively coupled to the different groups of vias, as shown in FIGS. 6 and 7 and as described in more detail herein.

To further enhance the quality of RF grounding, vias 906–922 may be arranged such that at least one via is located proximate to a downbonding location. Downbonds (wirebonds) are typically formed to establish a ground for active circuit chips by way of the die attach pad. FIG. 9 depicts a downbond 924 that connects active chip 902 to die attach pad 904. As shown, downbond 924 forms an electrical connection between a downbond location 926 on die attach pad 904 and a downbond location 928 on active circuit chip 902. Notably, vias 906 and 908 are both relatively close to downbond location 928. This proximity enhances the quality of the RF ground to active circuit chip 902 (ideally, the length of the ground path should be as short as possible to minimize parasitic inductance).

Configuration of Die Attach Pads

In accordance with another preferred aspect of the present invention, the die attach pads on the MCM substrate are configured to enhance the electrical, mechanical, and/or thermal characteristics of the MCM. The specific layout of the die attach pads may depend on a number of design parameters, e.g., the type of active circuit chips used, whether the active chips perform multiple functions, the extent of downbonding necessary, the number of signal terminations associated with the active chips, the desired amount of RF isolation between active components, and the like.

Referring again to FIG. 9, die attach pad 904 may be suitably shaped to accommodate a number of downbond locations 932 and 934 and a number of conductive pads 936–940. To minimize parasitic effects, downbond locations such as locations 932 and 934 are positioned such that the length of the wire bonds 942 and 944 are kept as short as possible. In a practical embodiment, downbond locations 932 and 934 reside on respective protruding or extending portions of die attach pad 904. The use of such protrusions may be desirable in applications where line density or package size is a contributing factor to the overall design of the MCM.

Conductive pads 936–940 may be utilized for the routing of input or output signals. To reduce parasitics and RF interference, the distance between active circuit chip 902 and conductive pads 936–940 is preferably kept to a practical minimum. Accordingly, die attach pad 904 may be suitably configured such that conductive pads 936–940 may be positioned close to the respective attachment points on active circuit chip 902. In this manner, the overall shape of die attach pad 904 can accommodate any number of conductive pads and downbonds while conserving space on the surface of the substrate.

Figure 10:
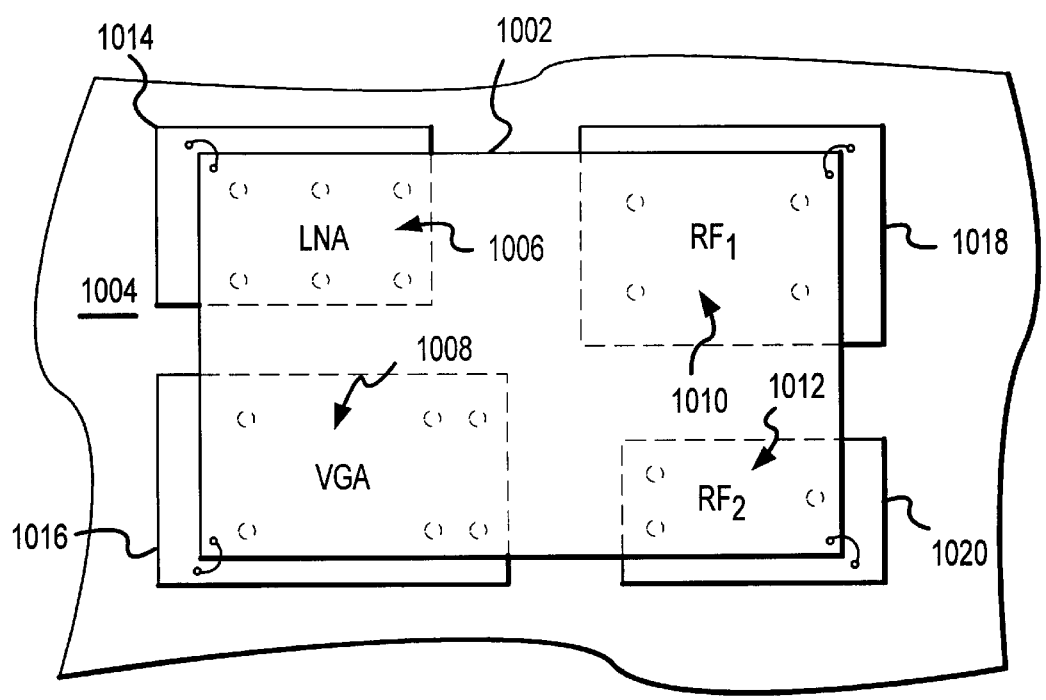

FIG. 10 is a schematic top view of an exemplary multi-function active circuit chip 1002 mounted to an MCM substrate 1004. Circuit chip 1002 may be configured to perform a number of different RF functions associated with one or more operating frequencies. For purposes of illustration, active chip 1002 is shown having an LNA section 1006, a VGA section 1008, a first additional RF section 1010 (e.g., an RF input section), and a second additional RF section 1012 (e.g., an RF output section).

Substrate 1004 preferably includes a plurality of distinct die attach pads associated with active chip 1002. A first die attach pad 1014 may predominantly correspond to LNA section 1006, a second die attach pad 1016 may predominantly correspond to VGA section 1008, a third die attach pad 1018 may predominantly correspond to RF section 1010, and a fourth die attach pad 1020 may predominantly correspond to RF section 1012. Insulating areas may be defined between the various die attach pads 1014–1020. The separate die attach pads 1014–1020 may be suitably configured to address RF isolation, EMI interference, and/or thermal dissipation issues. For example, a number of vias (shown in phantom) may establish electrical and thermal connections to one or more ground planes. As described in more detail herein, the MCM may employ split RF ground planes, located at intermediate metal layers or at the lower exposed metal layer, to promote effective RF grounding and isolation between different RF chips or different sections within a single RF chip.

Different Active Chip Types in One MCM

As described briefly above, MCM 100 may include any combination of various types of active circuit chips 104, e.g., CMOS, bipolar, GaAs, or other suitable die technologies. The capability of combining multiple chip technologies mounted to a single substrate 102 increases the design flexibility associated with MCM 100. Accordingly, MCM 100 can utilize any given type of active circuit chip 104 in a manner that optimizes manufacturing cost, electrical performance, and other design factors.

The use of different active chip types can lead to a more versatile design for substrate 102. For example, as described above in connection with FIGS. 1–3, GaAs chips are typically mounted on an exposed die attach pad 112 to provide a thermal sink to a ground plane or a motherboard to which MCM 100 is attached. In contrast, silicon-based chips may be mounted to an area covered with solder mask (or any suitably insulated area). In this manner, metal lines may be routed directly underneath the silicon chip or vias to other metal layers can be formed without adversely interacting with the RF signals associated with the active silicon chip. The solder mask layer effectively isolates the conductive metal line from the silicon chip. Consequently, the density of metal lines contained in MCM 100 can be increased if silicon-based active chips (or other suitable chip types) are mounted over an area of solder mask.

Surface Mount and Wire Bonding Technology

As described above in connection with FIGS. 1–3, MCM 100 preferably includes a number of surface mounted discrete components 106 and a number of active circuit chips 104 that have wire bonded electrical connections associated therewith. The use of reflow surface mount technology in conjunction with wire bonding technology for a single MCM package is desirable to reduce manufacturing cost and increase production volume while still achieving the electrical performance and packaging goals, FIGS. 6,7, and 9 show wire bonds 612, 620, 622, 720, and 924 leading from the active circuit chips to a number of contact points resident on the respective substrates. FIG. 6 shows wire bonds 620 and 622 connecting points on circuit chip 602 to respective contact pads 630 and 632 on substrate 608. In turn, the contact pads may be electrically coupled to vias that provide an electrical connection to other metal lines contained in substrate 608.

The present invention overcomes difficulties associated with the plating and cleaning of solder pads and wire bond pads, and problems associated with solder flow (shorting may occur due to the physical proximity of discrete components 106 to active components 104 and to neighboring electrical contact locations). For example, the characteristics of the plating material (e.g., gold) used for wire bond pads can differ from the characteristics of the plating material used for solder pads. In addition, electrolytic plating processes that may otherwise be utilized in conventional MCMs are unsuitable for RF applications because the metallic bars or stubs that remain can drastically alter the RF circuitry. By addressing these obstacles, MCM 100 is capable of combining surface mounted discrete components with wire bonded active circuit chips on a single dielectric substrate.

Backside Terminations

The prior art is replete with techniques for providing terminal connections between an integrated circuit package, e.g., an MCM, and the next assembly level, e.g., a motherboard. For example, a conventional MCM may employ a ball grid array (BGA), a pin grid array (PGA) a land grid array (LGA), a castellation array, or the like. However, prior art MCMs are often limited to a single termination scheme and, consequently, the MCM substrate must be designed with the termination scheme as a limiting factor.

In contrast to conventional MCMs, an MCM in accordance with the present invention may combine one or more exposed attachment pads (e.g., ground pads) with a number of peripheral contact pads. FIG. 5 depicts the bottom side of an exemplary MCM 500 that employs a number of relatively large ground pads 502 and 504 and a number of outer land grid pads 510. In an alternate embodiment, solder balls may be employed as a termination device. An LGA may be preferred in RF applications because the higher standoff associated with solder balls typically introduces unwanted parasitics. FIG. 3 depicts the use of castellations 120 (plated half-cylinders) for terminations. Castellations 120 may be desirable in certain applications where it is necessary to visually inspect the integrity of the soldered connections between the castellations and the motherboard.

In accordance with the present invention, an MCM can use any combination of termination schemes in a single package. The versatile and flexible nature of such a termination scheme allows the MCM to take advantage of the benefits of the different types of terminations to contemplate electrical and manufacturing issues.

Adjustable Printed Passive Components

As shown in FIG. 3, an MCM may include printed passive components such as a printed inductor 150; such printed components may be connected to active circuit chips, conductive pads, terminations, discrete components, or the like. Printed resistors, capacitors, inductors, and transformers can be utilized for purposes of tuning, matching, bypassing, or isolation. Prior art MCM substrates may be limited in terms of the adjustability of such printed components; typically, the electrical characteristics of printed components are fixed with the design of the substrate.

Figure 11:
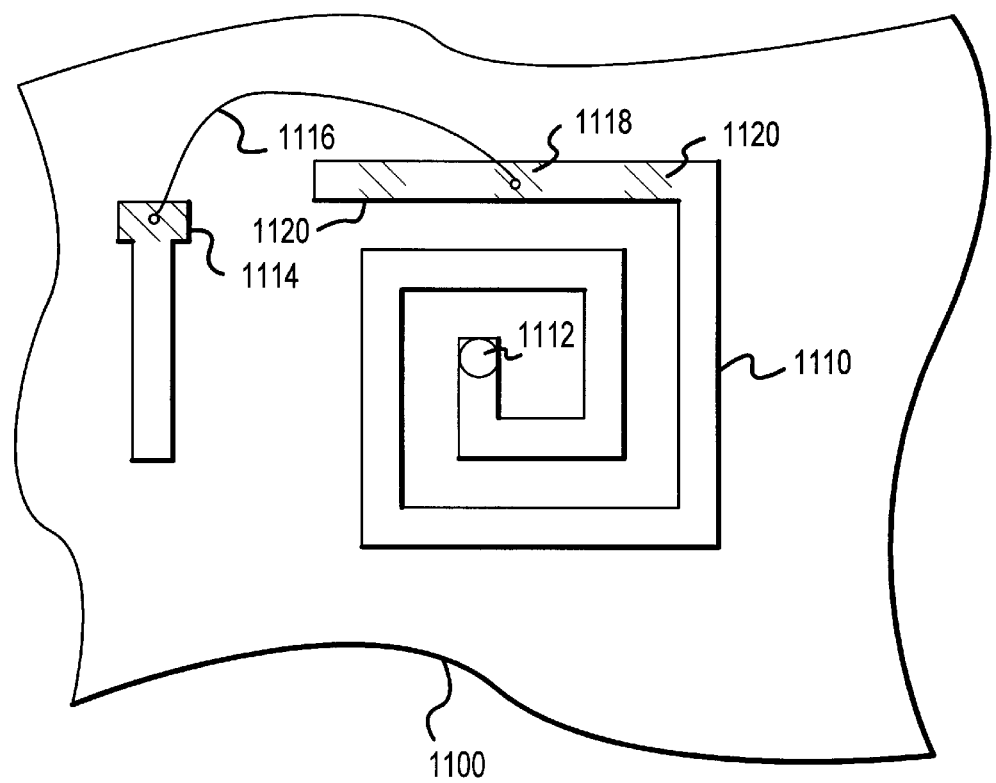
FIGS. 11–12 are each a schematic top view of a printed inductor component that may be utilized in an MCM.
Figure 12:
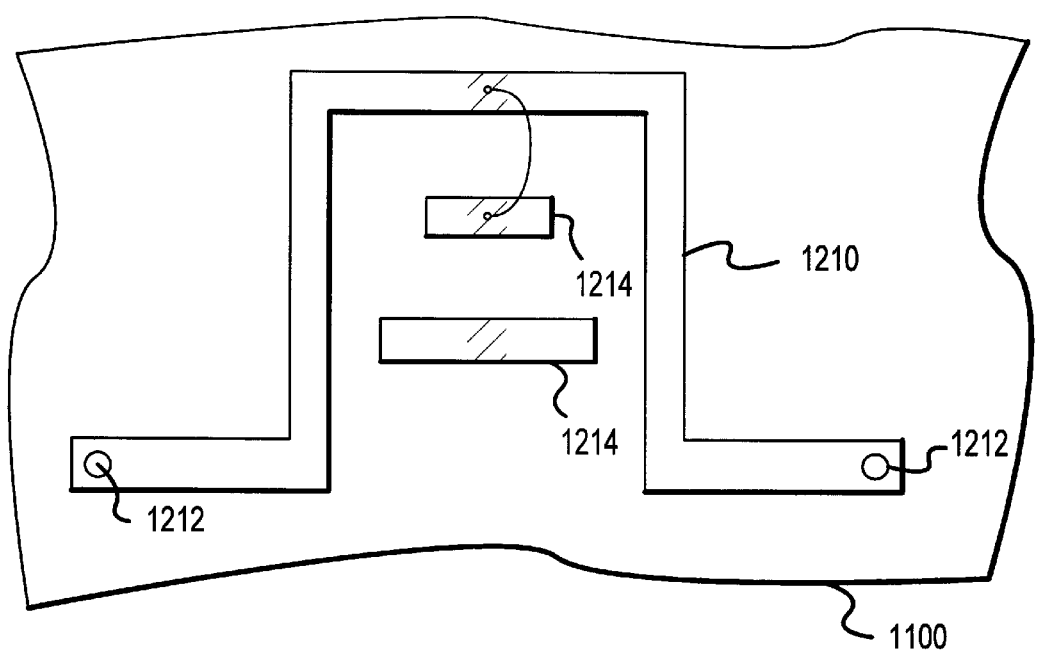

Referring to FIGS. 11 and 12, an MCM substrate 1100 may include any number of adjustable printed components. FIG. 11 is a schematic representation of an exemplary printed spiral inductor 1110 and FIG. 12 is a schematic representation of an exemplary printed horseshoe inductor 1210. In accordance with conventional techniques, these printed components may reside at the first metal layer of substrate 1100. A suitable insulating material, such as solder mask, may be applied to those portions of inductors 1110 and 1210 that are not meant to be exposed. Inductors 1110 and 1210 are both preferably configured such that their respective inductances can be altered if necessary after substrate 1100 is produced.

Spiral inductor 1100 may be electrically connected at one end to a conductive via 1112 or any suitable conductive junction. A first end of a wire bond 1116 may be electrically connected to a conductive pad 1114 using conventional wire bonding techniques. A second end of wire bond 1116 is shown electrically connected to a location 1118 proximate the outer end of spiral inductor 1100. Location 1118 may be exposed by removing a suitable portion of the solder mask material. In accordance with this exemplary embodiment, any number of secondary locations 1120 may be utilized as a contact point for wire bond 1116. These secondary locations 1120 may be employed to tune the inductance of spiral inductor 1100 to a desired value.

Horseshoe inductor 1210 may be electrically connected at both ends to respective conductive vias or conductive pads 1212. By itself, horseshoe inductor 1210 may have a certain inductance that approximates a specific design value. Due to manufacturing tolerances and interaction with other components associated with the MCM, horseshoe inductor 1210 may not have an optimized inductance. Accordingly, any number of secondary inductors 1214 may be printed proximate to horseshoe inductor 1210. Secondary inductors 1214 are configured to facilitate the adjustment of the inductance associated with horseshoe inductor 1210. As shown in FIG. 12, a secondary inductor 1214 may be wire bonded in parallel with horseshoe inductor 1210 to effectively reduce the overall inductance measured between vias 1212. The total inductance may be suitably adjusted depending upon the inductance associated with the various secondary inductors 1214. Although only two secondary inductors 1214 are depicted in FIG. 12, any number may be printed on substrate 1100. In addition, any number of secondary inductors may be wire bonded together to enable the versatile adjustment of the inductance. Furthermore, a glob or droplet of solder may be used to shorten the path between inductor turns.

These and other techniques may be utilized to adjust resistive and capacitive elements contained on substrate 1100. It should be appreciated that these adjustment techniques may also be applied in the context of three dimensional components.

In summary, a versatile MCM module in accordance with the present invention may employ a number of features to enable the integration of different RF functions onto a single substrate package. RF isolation, EMI protection, electrical performance, thermal dissipation, high volume manufacturability, power management, and low cost production are important parameters that are considered during the design of the MCM. The flexible nature of the MCM elements allows these and other design parameters to be accounted for in the production of practical MCM packages.

The present invention has been described above with reference to a preferred embodiment. However, those skilled in the art will recognize that changes and modifications may be made to the preferred embodiment without departing from the scope of the present invention. For example, the substrate layouts and particular components described herein are merely exemplary. In addition, the specific functionality of any given MCM package will vary from application to application. These and other changes or modifications are intended to be included within the scope of the present invention, as expressed in the following claims.

What is claimed is:

1. A multiple chip module comprising:
   single interconnect substrate;
   at least one RF/IF active circuit chip configured to perform a plurality of RF/IF functions, said at least one RF/IF active circuit chip being coupled to said single interconnect substrate; and
   at least one passive component coupled to said single interconnect substrate; wherein
      said single interconnect substrate is configured to enable said multiple chip module to integrate said plurality of RF/IF functions.

2. A multiple chip module according to claim 1, wherein said at least one RF/IF active circuit chip comprises a first RF/IF active circuit chip and a second RF/IF active circuit chip having different electrical characteristics than said first RF/IF active circuit chip.

3. A multiple chip module according to claim 2, wherein said first and second RF/IF active circuit chips are configured to operate at different RF/IF frequencies.

4. A multiple chip module according to claim 2, further comprising at least one matching network integrated into said single interconnect substrate, said at least one matching network being associated with at least one of said first and second RF/IF active circuit chips.

5. A multiple chip module according to claim 4, wherein said matching network comprises at least one of a transmission line, an inductor, a printed component, a resistor or a capacitor.

6. A multiple chip module according to claim 1, wherein said at least one RF/IF active circuit chip comprises a first RF/IF active circuit chip configured in accordance with a first die technology and a second RF/IF active circuit chip configured in accordance with a second die technology.

7. A multiple chip module according to claim 1, wherein said single interconnect structure comprises a plurality of electrical terminations, said plurality of electrical terminations being configured in accordance with one of a plurality of termination schemes.

8. A multiple chip module according to claim 7, wherein said plurality of termination schemes comprises a ball grid array scheme, a pin grid array scheme, a land grid array scheme, and a castellation array scheme.

9. A multiple chip module comprising:
   a single interconnect substrate comprising an outer surface having a plurality of wire bond contact points resident thereon;
   an RF/IF active circuit chip configured to perform at least one RF/IF function, said at least one RF/IF active circuit chip being coupled to said plurality of wire bond contact points with a like number of wire bonds; and
   a passive component surface-mounted to said single interconnect substrate.

10. A multiple chip module according to claim 9, wherein said passive component is surface-mounted using a reflow solder technique.

11. A multiple chip module according to claim 9, wherein said plurality of wire bond contact points comprises at least one downbond contact points associated with an RF/IF ground and at least one signal contact points associated with a like number of electrical signals.

12. A multiple chip module according to claim 9, further comprising a die attach pad resident on said outer surface and a plated through via formed within said single interconnect substrate, said plated through via establishing electrical contact with said die attach pad, wherein the position of at least one of said plurality of wire bond contact points is related to the position of said plated through via.

13. A multiple chip module according to claim 12 wherein said at least one of said plurality of wire bond contact point is proximate said plated through via.

14. A multiple chip module comprising:
   a single interconnect substrate;
   a first RF/IF active circuit chip coupled to said single interconnect substrate, said first RF/IF active circuit chip being configured to perform a first RF/IF function;
   a second RF/IF active circuit chip coupled to said single interconnect substrate, said second RF/IF active circuit chip being configured to perform a second RF/IF function;

a first ground plane integral to said single interconnect substrate and operatively associated with said first RF/IF active circuit chip; and a second ground plane integral to said single interconnect substrate and operatively associated with said second RF/IF active circuit chip.

15. A multiple chip module according to claim 14, wherein said first and second ground planes are physically distinct from one another.

16. A multiple chip module according to claim 14, wherein said first and second ground planes are configured to electronically isolate said first and second RF/IF active circuit chips.

17. A multiple chip module according to claim 14, wherein said first and second ground planes are configured to reduce the amount of RF/IF interference between said first and second RF/IF active circuit chips.

18. A multiple chip module according to claim 14, wherein said first and second ground planes are configured to enable said multiple chip module to integrate said first and second RF/IF functions.

19. A multiple chip module according to claim 14, wherein:

said single interconnect substrate comprises a plurality of metal layers including an internal metal layer; and at least one of said first and second ground planes resides at said internal metal layer.

20. A multiple chip module according to claim 14, wherein:

said single interconnect substrate comprises a plurality of metal layers including an outer metal layer; and at least one of said first and second ground planes resides at said outer metal layer.

21. A multiple chip module according to claim 20, wherein said at least one of said first and second ground planes is further configured to function as a conductive attachment pad for said multiple chip module.

22. A multiple chip module according to claim 14, further comprising a plated through via formed within said single interconnect substrate, said plated through via being configured to establish an electrical connection between said first RF/IF active circuit chip and said first ground plane.

23. A multiple chip module according to claim 22, further comprising a die attach pad resident on an outer surface of said single interconnect substrate, said plated through via establishing electrical contact with said die attach pad.

24. A multiple chip module according to claim 14, further comprising a conductive lid coupled to said single interconnect substrate, said conductive lid being configured to cooperate with said first ground plane to enhance electronic isolation of said first RF/IF active circuit chip.

25. A multiple chip module according to claim 24, wherein said conductive lid is electrically connected to said first ground plane.

26. A multiple chip module according to claim 25, further comprising a plated via configured to establish an electrical connection between said first ground plane and said conductive lid.

27. A multiple chip module according to claim 24, further comprising a conductive strip located on said single interconnect substrate, said conductive strip being electrically coupled to said conductive lid to enhance electronic isolation of said first RF/IF active circuit chip.

28. A multiple chip module according to claim 27, wherein said conductive strip is located between said first and second RF/IF active circuit chips.

29. A multiple chip module comprising:

a single interconnect substrate;

an RF/IF active circuit chip coupled to said single interconnect substrate, said first RF/IF active circuit chip having a first portion configured to perform a first RF/IF function and a second portion configured to perform a second RF/IF function; wherein said single interconnect substrate comprises a first ground plane operatively associated with said first portion of said RF/IF active circuit chip and a second ground plane operatively associated with said second portion of said second RF/IF active circuit chip.

30. A multiple chip module according to claim 29, wherein said first and second ground planes are physically distinct from one another.

31. A multiple chip module according to claim 29, wherein said first and second ground planes are configured to electronically isolate said first and second portions of said RF/IF active circuit chip.

32. A multiple chip module according to claim 29, wherein said first and second ground planes are configured to reduce the amount of RF/IF interference between said first and second portions of said RF/IF active circuit chip.

33. A multiple chip module according to claim 29, wherein at least one of said first and second ground planes is further configured to function as a conductive attachment pad for said multiple chip module.

34. A multiple chip module according to claim 29, further comprising a conductive lid coupled to said single interconnect substrate, said conductive lid being configured to cooperate with said first ground plane to enhance electronic isolation of said first portion of said active circuit chip.

35. A multiple chip module comprising:

a single interconnect substrate comprising an upper surface and a lower surface, said upper surface having a die attach pad located thereon and said lower surface having a conductive ground attachment pad located thereon;

an RF/IF active circuit chip coupled to said die attach pad; and a via formed within said single interconnect substrate, said via being configured to establish an electrical and thermal connection between said RF/IF active circuit chip and said conductive ground attachment pad.

36. A multiple chip module according to claim 35, further comprising any combination of blind vias, buried vias, plated through vias, and additional plated through vias configured and arranged to enhance electrical performance of said RF/IF active circuit chip.

37. A multiple chip module according to claim 36, wherein:

said single interconnect substrate comprises a plurality of metal layers including an internal metal layer; and at least one of said blind vias and said buried vias is electrically coupled to said internal metal layer.

38. A multiple chip module according to claim 37, wherein said internal metal layer is configured as a ground plane for said RF/IF active circuit chip.

39. A multiple chip module according to claim 35, wherein said plated through via is filled with a thermally conductive material.

40. A multiple chip module according to claim 39, wherein said thermally conductive material is also electrically conductive.

41. A multiple chip module according to claim 35 wherein said via is a plated through via.

42. A multiple chip module according to claim 35 wherein said via comprises a plated through via and further comprising at least one of a blind via, a buried via or an additional plated through via.

43. A multiple chip module comprising:
a single interconnect substrate comprising an outer surface having a die attach pad resident thereon;
an RF/IF active circuit chip coupled to said die attach pad, said RF/IF active circuit chip being configured to perform a plurality of RF/IF functions; and
a plurality of plated through vias electrically coupled to said die attach pad, said plurality of plated through vias being positioned, relative to said die attach pad, to enhance isolation between said plurality of RF/IF functions.

44. A multiple chip module according to claim 43, wherein:
said RF/IF active circuit chip comprises a first portion configured to perform a first RF/IF function and a second portion configured to perform a second RF/IF function;
said plurality of plated through vias comprises a first number of plated through vias operatively associated with said first RF/IF portion and a second number of plated through vias operatively associated with said second RF/IF portion; and
said first number of plated through vias are separately grouped from said second number of plated through vias.

45. A multiple chip module according to claim 44, wherein:
said single interconnect substrate further comprises a first ground plane operatively associated with said first portion of said RF/IF active circuit chip and a second ground plane operatively associated with said second portion of said second RF/IF active circuit chip;
said first number of plated though vias are electrically coupled to said first ground plane; and
said second number of plated through vias are electrically coupled to said second ground plane.

46. A multiple chip module according to claim 43, wherein at least one of said plated through vias is proximate to a downbonding location associated with said RF/IF active circuit chip.

47. A multiple chip module according to claim 46, wherein said die attach pad contains said downbonding location.

48. A multiple chip module comprising:
a single interconnect substrate;
a die attach pad located on an outer surface of said single interconnect substrate; and
at least one RF/IF active circuit chip configured to perform a plurality of RF/IF functions, said at least one RF/IF active circuit chip being coupled to said die attach pad; wherein
said die attach pad is configured to enhance electrical characteristics of said multiple chip module such that said plurality of RF/IF functions are substantially integrated onto said single interconnect substrate.

49. A multiple chip module according to claim 48, wherein:
said RF/IF active circuit chip comprises a first portion configured to perform a first RF/IF function and a second portion configured to perform a second RF/IF function;
said die attach pad comprises a first area operatively associated with said first portion and a second area operatively associated with said second portion; and
said first and second areas are physically distinct from each other.

50. A multiple chip module according to claim 49, wherein:
said single interconnect substrate further comprises a first ground plane operatively associated with said first portion of said RF/IF active circuit chip and a second ground plane operatively associated with said second portion of said second RF/IF active circuit chip;
said first area is electrically coupled to said first ground plane; and
said second area is electrically coupled to said second ground plane.

51. A multiple chip module according to claim 48, wherein said die attach pad comprises a protrusion configured to accommodate a wirebond connection between said RF/IF active circuit chip and said die attach pad.

52. A multiple chip module according to claim 48, further comprising a number of conductive pads located on said outer surface of said single interconnect substrate, wherein said die attach pad and said number of conductive pads are cooperatively configured such that said number of conductive pads are located proximate to said RF/IF active circuit chip.

53. A multiple chip module according to claim 52, wherein said die attach pad and said number of conductive pads are cooperatively configured to minimize the length of wirebonds used to electrically couple said RF/IF active circuit chip to said number of conductive pads.

54. A multiple chip module comprising:
a single interconnect substrate comprising an outer surface having a plurality of wire bond contact points resident thereon;
an active circuit chip downbonded to one of said contact points;
a first ground plane integral to said interconnect substrate and operatively associated with an RF section;
a second ground plane integral to said interconnect substrate and operatively associated with an IF section;
a passive component embedded in said interconnect substrate; and
a passive component surface-mounted to said interconnect substrate.

55. A multiple chip module according to claim 54, wherein said RF section comprises a first active circuit chip and said IF section comprises a second active circuit chip.

56. A multiple chip module according to claim 54, wherein said active circuit chip is configured to include said RF section and said IF section.

57. A multiple chip module according to claim 54, further comprising a second active circuit chip wherein said first active circuit chip configured in accordance with a first die technology and said second active circuit chip configured in accordance with a second die technology.

58. A multiple chip module according to claim 54, wherein said passive component is surface-mounted using a reflow solder technique.

59. A multiple chip module according to claim 54, wherein:
said single interconnect substrate comprises a plurality of metal layers including an internal metal layer; and
at least one of said first and second ground planes resides at said internal metal layer.

60. A multiple chip module according to claim 54, further comprising a conductive strip located on said single interconnect substrate.

61. A multiple chip module according to claim 60, further comprising a second active circuit chip and said conductive strip is located between said first and second active circuit chips.

62. A multiple chip module according to claim 54, wherein at least one of said first and second ground planes is further configured to function as a conductive attachment pad for said multiple chip module.

63. A multiple chip module according to claim 54, further comprising a conductive lid coupled to said single interconnect substrate.

64. A multiple chip module according to claim 54, further comprising at least one plated through vias proximate to the downbonding location of said active circuit chip.

65. A multiple chip module comprising:
a single interconnect substrate;
at least one active circuit chip coupled to said substrate and configured to perform an RF function and an IF function; and
a plurality of passive components coupled to said substrate, at least one of said passive components comprising a printed passive component.

66. A multiple chip module according to claim 65, wherein said printed passive component comprises a printed spiral inductor.

67. A multiple chip module according to claim 65, wherein said single interconnect substrate comprises a plurality of metal layers.

68. A multiple chip module according to claim 67, wherein said printed passive component resides on a top metal layer of said substrate.

69. A multiple chip module according to claim 65, wherein at least one of said passive components surface-mounted to said single interconnect substrate.

70. A multiple chip module according to claim 69, wherein at least one of said active circuit chips wire bonded to said single interconnect substrate.

71. A multiple chip module according to claim 65, further comprising a single active circuit chip.

72. A multiple chip module according to claim 65, further a first active circuit chip configured to perform an RF function and a second active circuit chip configured to perform an IF function.

73. A multiple chip module comprising:
a single interconnect substrate;
at least one active circuit chip downbonded to said substrate and configured to perform an RF function and an IF function; and
a plurality of passive components coupled to said substrate.

74. A multiple chip module according to claim 73, further comprising at least one plated through vias proximate to the downbonding location of said active circuit chip.

75. A multiple chip module according to claim 73, further comprising a second active circuit chip wherein said first active circuit chip configured in accordance with a first die technology and said second active circuit chip configured in accordance with a second die technology.

76. A multiple chip module according to claim 73, further comprising a conductive strip separating said RF function and said IF function on said single interconnect substrate.

* * * * *